United States Patent
Marchand et al.

(10) Patent No.: US 10,637,510 B2
(45) Date of Patent: Apr. 28, 2020

(54) METHODS AND DEVICES FOR ERROR CORRECTING CODES DECODING

(71) Applicant: UNIVERSITE DE BRETAGNE SUD, Lorient (FR)

(72) Inventors: Cédric Marchand, Queven (FR); Emmanuel Boutillon, Lorient (FR)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 0 days.

(21) Appl. No.: 15/498,589

(22) Filed: Apr. 27, 2017

(65) Prior Publication Data

US 2017/0317695 A1 Nov. 2, 2017

(30) Foreign Application Priority Data

May 2, 2016 (EP) ..................... 16305510

(51) Int. Cl.
*H03M 13/37* (2006.01)
*H03M 13/15* (2006.01)
(Continued)

(52) U.S. Cl.
CPC ... *H03M 13/3746* (2013.01); *H03M 13/1102* (2013.01); *H03M 13/1117* (2013.01);
(Continued)

(58) Field of Classification Search
CPC ......... H03M 13/3746; H03M 13/1102; H03M 13/1117; H03M 13/1171; H03M 13/1575; H03M 13/6502
See application file for complete search history.

(56) References Cited

U.S. PATENT DOCUMENTS

2009/0158128 A1* 6/2009 Yokokawa ............ H03M 13/15
714/780
2012/0079236 A1* 3/2012 Suvakovic ............ G06F 9/3897
712/30
(Continued)

OTHER PUBLICATIONS

Chen, C., et al., "A Symbol-Reliability Based Message-Passing Decoding Algorithm for Nonbinary LDPC Codes over Finite Fields," 2010 6th International Symposium on Turbo Codes & Iterative Information Processing, Conference Location: Brest, France, Date of Conference: Sep. 6-10, 2010, pp. 251-255. (Year: 2010).*
(Continued)

*Primary Examiner* — Kyle Vallecillo
(74) *Attorney, Agent, or Firm* — Meagher Emanuel Laks Goldberg & Liao, LLP

(57) ABSTRACT

Devices and methods for decoding a signal encoded using an error correcting code are provided. For example, a check node processing unit is provided for a decoder to receive at least two input messages and to generate at least one output message, each message comprising a plurality of components. The check node processing unit comprises a data structure configured to store the input messages, the components of the input messages being associated with an integer index. The check node processing unit also comprises a data processing unit configured to apply one or more iterations of a transformation operation to at least a part of the data structure depending on at least some of the components of the input messages associated with a given value of the integer index, which provides a transformed data structure. The check node processing unit further comprises a calculation unit configured to determine at least one output message from the transformed data structure.

14 Claims, 6 Drawing Sheets

(51) Int. Cl.
*H03M 13/11* (2006.01)
*H03M 13/00* (2006.01)

(52) U.S. Cl.
CPC ... *H03M 13/1171* (2013.01); *H03M 13/1575* (2013.01); *H03M 13/6502* (2013.01)

(56) References Cited

U.S. PATENT DOCUMENTS

2015/0263763 A1* 9/2015 Kim .................. H03M 13/1171
714/752
2015/0349801 A1 12/2015 Park et al.

OTHER PUBLICATIONS

European Search Report for 16305510.6 dated Nov. 7, 2016.
Schlafer Phillip et al: "Syndrom based check node processing of high order NB-LDPC decoders", Proc. 2015 22nd International Conference on Telecommunications (ICT), IEEE, Apr. 27, 2015 (Apr. 27, 2015), pp. 156-162.
Schlafer Phillip et al: "A new architecture for high throughput, low latency, NB-LDPC check node processing", Proc. 2015 IEEE 26th Annual International Symposium On Personal, Indoor, and Mobile Radio Communications (PIMRC), IEEE, Aug. 30, 2015 (Aug. 30, 2015), pp. 1392-1397.
Xinmiao Zhang et al: "Reduced-complexity extended Min-sum check node processing for non-binary LDPC decoding", Proc. 2010 53rd IEEE International Midwest Symposium on Circuits and Systems (MWCAS), IEEE, Piscataway, NJ, USA, Aug. 1, 2010 (Aug. 1, 2010), pp. 737-740.
Boutillon Emmanuel et al: Design of a GF(64)-LDPC Decoder Based on the EMS Algorithm, IEEE Transactions on Circuits and Systems I: Regular Papers, IEEE, US, vol. 60, No. 10, Oct. 1, 2013 (Oct. 1, 2013), pp. 2644-2656.
Voicila A et al: "Low-Complexity, Low-Memory EMS Algorithm for Non-Binary LDPC Codes", Proceedings 2007 IEEE International Conference on Communications (ICC 2007), Jun. 24-28, 2007, Glasgow, UK, IEEE, Piscataway, NJ, USA, Jun. 1, 2007 (Jun. 1, 2007), pp. 671-676.
Cedric Marchand et al: "NB-LDPC check node with pre-sorted input", Preprint—International Symposium on Turbo Codes & Iterative Information Processing 2016, Sep. 16, 2016 (Sep. 16, 2016), pp. 1-6.
N. Wiberg, H-A. Loeliger, and R. Kotter, "Codes and Iterative Decoding on General Graphs", European Transactions on Telecommunications and Related Technologies, special issue on Turbo Coding, Jun. 1995.
M. Davey and D. MacKay, "Low-density parity check codes over GF (q)", IEEE Communications Letters, vol. 2, No. 6, pp. 165-167, Jun. 1998.
D.J.C. Mackay and M. Davey, "Evaluation of Gallager Codes for Short Block Length and High Rate Applications", In Proceedings of IMA Workshop on Codes, Systems and Graphical Models, 1999.
L. Barnault and D. Declercq, "Fast decoding algorithm for LDPC over GF(q)", In Proceedings of IEEE Information Theory Workshop, pp. 70-73, Apr. 2003.
H. Sadjadpour, "Maximum A Posteriori Decoding Algorithms for Turbo Codes", In Proceedings of SPIE, vol. 4045, 2000.
D. Declercq and M. Fossorier, "Decoding algorithms for non-binary LDPC codes over GF", IEEE Transactions on Communications, vol, 55, No. 4, pp. 633-643, Apr. 2007.
V. Savin, "Min-max decoding for non-binary LDPC codes", In Proceedings of IEEE International Symposium on Information Theory, pp. 960-964, Jul. 2008.
E. Boutillon and L. Conde-Canencia, "Bubble check: a simplified algorithm for elementary check node processing in extended minsum non-binary LDPC decoders", Electronics Letters, vol. 46, No. 9, pp. 633-634, Apr. 2010.

* cited by examiner

METHODS AND DEVICES FOR ERROR CORRECTING CODES DECODING

TECHNICAL FIELD

The invention generally relates to digital communications, and in particular to methods and devices for decoding a signal encoded using an error correcting code.

BACKGROUND

Error detection and correction techniques are conventionally used to preserve integrity of data in computing and communication systems. Such techniques are extensively used to achieve reliable data storage and transfer in numerous applications comprising digital video, communication and storage in media devices and computers.

Error detection techniques enable the detection of errors caused by noise, interference or other impairments during the transmission of data from a transmitter to a receiver. Exemplary error detection techniques comprise repetition codes, parity bits and cyclic redundancy checks.

Error correction techniques not only enable the detection of errors but also enable reconstruction of the original error-free data. Exemplary error correction techniques comprise automatic repeat requests and forward error correcting codes.

Encoding process using error correcting codes (ECCs) is based on the addition of a redundant data to the original information data. The redundancy allows a receiver to detect and possibly correct transmission errors without requiring retransmissions of original data.

Existing error correcting codes comprise linear codes according to which any linear combination of a codeword is also a codeword. Linear codes are generally partitioned into 'block codes' and 'convolutional codes'. Block codes process blocks of data of a fixed size while convolutional codes process data symbol-by-symbol. Linear block codes are widely used because they are less complex and easier to implement than convolutional codes. Exemplary linear block codes comprise Hamming codes, Reed-Solomon codes, Turbo codes and low-density parity-check (LDPC) codes.

A linear block code of length n and rank k encodes a block of symbols of length k into a vector, called 'codeword', of length n>k, by adding n−k redundancy symbols called 'parity symbols'. The aim of the extra parity symbols is to detect and possibly correct any error that occurred during the transmission. Such codes may be represented using a 'codebook', a 'matrix' or a 'graph' representation.

The codebook representation defines the dictionary of allowable codewords and the linear space to which they belong. For example, for linear codes constructed on Galois fields of order q≥2, noted GF(q), the symbols comprised in a codeword take values in GF(q). A codeword is thus a vector of n symbols that belong each to GF(q). The code is binary if the symbols belong to GF(2). In contrast, when q>2, the code is said non-binary.

The matrix representation of a linear block code defines a generator matrix, generally denoted by G, and a parity-check matrix, generally denoted by H, linked by the relation $G \cdot H^t = 0$. Entries of the generator and parity-check matrices belong to the field over which is constructed the code. The parity-check matrix defines the parity-check constraints designed to be satisfied by the codewords. In particular, non-zero entries of each row of the parity-check matrix define a parity-check equation to be satisfied by any codeword.

Linear block codes may be equivalently represented by a bipartite graph, termed 'Tanner graph'. Such representation comprises two sets of nodes: a first set of nodes referred to as 'variable nodes' and a second set of nodes referred to as 'check nodes'. Variable nodes and check nodes are linked together by paths (hereinafter referred to as "edges"). Variable nodes and check nodes form processing units. Each variable node is associated with a column of the parity-check matrix. Each check node is associated with a row of the parity-check matrix, i.e. with a parity-check equation. The connections between variable nodes and check nodes are determined by the non-zero entries of the parity-check matrix. In particular, LDPC codes are specified by sparse parity-check matrices comprising a number of zero entries greatly higher than the number of non-zero entries. The corresponding Tanner graphs are generally characterized by a small number of edges. Such a property provides considerable advantages in terms of the computational complexity required for the decoding.

An iterative decoder may be used to decode data encoded using a linear block error correcting code. Given the channel output in a communication channel or a received sequence of symbols, an iterative decoder processes a signal during multiple iterations bringing it, at each iteration, closer to the original transmitted codeword.

Iterative decoding algorithms for linear block error correcting codes use the Tanner graph representation of the underlying code. Generally, each node in the Tanner graph maps to a processing unit in the hardware and/or software implementation. The iterative decoding process consists accordingly in exchanging messages between the variable node processing units and check node processing units and vice-versa via the different paths in the Tanner graph to estimate the most reliable codeword from the noisy received sequence of symbols. Each variable node processing unit or check node processing unit receives input messages from the corresponding connected nodes in the graph and delivers, after processing the input messages, output messages to at least one processing unit corresponding to a connected node in the Tanner graph.

The iterative decoding process comprises an initialization step during which the messages to be delivered by the variable node processing units are initialized from the channel output information. The exchange of messages involving the variable nodes and the check nodes is then performed iteratively. The decoding stops either if all parity-check constraints are satisfied, returning thus the decoded codeword, or by reaching a maximum number of iterations without meeting all parity check constraints.

The exchanged messages between the variable node and check node processing units carry representative information on the symbols. For example, in hard-decision decoding, exchanged messages may carry the value of the symbols. In soft-decision decoding, the symbols and metrics measuring their reliabilities (also referred to as 'reliability metrics') may be passed between the different processing units. The reliability metrics of a symbol may be for example its probability density function, measuring the probabilities that the symbol is equal to each value of GF(q).

In case of binary codes, a message is a vector comprising two values representative of the bit '0' and the bit '1'. In case of non-binary codes constructed over Galois fields GF(q) with q>2, a message is a vector comprising q values representative of the symbols that belong to GF(q). In addition, in soft-decision decoding, a message is a vector comprising q pairs of symbols and their reliability metrics.

Early iterative decoding algorithms were designed for binary codes and apply to binary LDPC codes. They are the 'sum-product' algorithm (also known as 'belief propagation' or 'message passing' algorithm) and the 'min-sum' algorithm disclosed both in "N. Wiberg, H-A. Loeliger, and R. Kotter, Codes and Iterative Decoding on General Graphs, European Transactions on Telecommunications and Related Technologies, special issue on Turbo Coding, June 1995". They provide near-optimal performance in terms of error decoding probability.

Decoding of non-binary linear block codes including non-binary LDPC codes can be also performed using iterative algorithms. Inspired by the sum-product algorithm, the 'q-ary sum-product' algorithm has been first proposed in "M. Davey and D. MacKay, Low-density parity check codes over GF(q), IEEE Communications Letters, vol. 2, no. 6, pages 165-167, June 1998". The complexity of the q-ary algorithm was too high to be applied in hardware implementations. To overcome this limitation, several solutions have been developed targeting mainly the reduction of the computational complexity at the check node processing units, which involves $0(q^2)$ operations per unit, the major part of the computational complexity of the decoding process.

First solutions have been independently disclosed in "D. J. C. Mackay and M. Davey, Evaluation of Gallager Codes for Short Block Length and High Rate Applications, In Proceedings of IMA Workshop on Codes, Systems and Graphical Models, 1999" and "L. Barnault and D. Declercq, Fast decoding algorithm for LDPC over GF(q), In Proceedings of IEEE Information Theory Workshop, pages 70-73, April 2003". They consist in versions of the q-ary algorithm in the frequency-domain using Fourrier Transform enabling for a computational complexity reduction.

Other logarithm domain approaches were developed enabling for more reduction of the computational complexity by transforming product operations to simple summation operations. The reliability metrics passed during the messages exchange are in this case expressed in the logarithm scale. Main results in this avenue comprise the 'max-log-map' turbo codes decoder disclosed in "H. Sadjadpour, Maximum A Posteriori Decoding Algorithms For Turbo Codes, In Proceedings of SPIE, vol. 4045, 2000" and the 'extended min-sum' (EMS) algorithm and 'min-max algorithm' for non-binary LDPC codes decoding.

In addition to the computation in the log-domain, the EMS algorithm applies message sorting and truncation to further reduce the computational complexity and memory requirements at check node processing units. Accordingly, each message (vector of q components) delivered to a check node processing unit is first sorted according to an order of the reliability metrics associated with the q symbols comprised in the message. Then, the sorted message is truncated such that only a number N<<q of components is kept and processed by the check node processing unit receiving the message as input. Message truncation is performed such that the most reliable symbols are retained to contribute in the computation of the output messages delivered by a check node processing unit. For a detailed description on the EMS algorithm, one can refer to the article "D. Declercq and M. Fossorier, Decoding algorithms for non-binary LDPC codes over GF, IEEE Transactions on Communications, vol, 55, no. 4, pages 633-643, April 2007".

The min-max algorithm is disclosed for example in "V. Savin, Min-max decoding for non-binary LDPC codes, In Proceedings of IEEE International Symposium on Information Theory, pages 960-964, July 2008". The Min-max algorithm is similar to the EMS algorithm. The only difference between them is that the min-max algorithm replaces the sum operations in the check node processing by max operations.

The computation of output messages at the level of the check node processing units from the sorted and truncated input messages can be performed according to various architectures. For example, a forward-backward architecture may be used to divide up the computations performed by a single check node processing unit into multiple computations involving multiple elementary check node processing units. Each elementary check node processing unit processes two or more input messages to generate intermediary results that are subsequently used by remaining elementary check node processing units in later stages. Exemplary algorithms for elementary check node processing are the 'Bubble check' algorithm and its improved version known as 'L-Bubble check' disclosed respectively in "E. Boutillon and L. Conde-Canencia, Bubble check: a simplified algorithm for elementary check node processing in extended min-sum non-binary LDPC decoders, Electronics Letters, vol. 46, no. 9, pp. 633-634, April 2010" and "E. Boutillon, L. Conde-Canencia, and A. Al Ghouwayel, Design of a GF(64)-LDPC Decoder based on the EMS algorithm, IEEE Transactions on Circuits and Systems, vol. 60, no. 10, pages 2644-2656, October 2013". The Bubble-check and L-Bubble check algorithms are in addition based on a reduction of the search space of the best intermediary results computed by an elementary check node processing unit from two input messages.

In another example, a recently developed architecture based on syndrome calculation may be used at check node processing units. Accordingly, the computation of output messages from the sorted and truncated input messages is performed in two steps. In the first step, the check node processing unit computes a set of values termed 'syndromes' involving all input messages. In a second step, a decorrelation operation is performed. In order to compute an output message to be delivered to a variable node processing unit, the contribution of the input message previously received from this variable node processing unit is cancelled from the computed syndromes through the decorrelation operation. The syndrome-based architecture is disclosed in "P. Schlafer, N. When, M. Alles, T. Lehnigk-Emden, and E. Boutillon, Syndrome based check node processing of high order NB-LDPC decoders, In Proceedings of the International Conference on Telecommunications, pages 156-162, April 2015" and "P. Schlafer, et al., A new Architecture for High Throughput, Low Latency NB-LDPC Check Node Processing, In Proceedings of IEEE International Symposium on Personal, Indoor and Mobile Radio Communications, August 2015". Syndrome-based check node processing allows an efficient parallel computation for higher-order Galois fields.

LDPC codes are very efficient linear block codes that can provide high transmission rates that approach the channel capacity, i.e. the theoretical maximum amount of information that can be transmitted over a communication channel. LDPC codes are finding expanding use in various applications including digital video broadcasting (DVB), long-haul optical communications, wireless local area network communications (e.g. standardized in Wi-Fi 802.11) and radio communications (3G, 4G/LTE, 5G and beyond).

Non-binary LDPC codes are particularly advantageous in applications requiring a high spectral efficiency. In addition, when the code length is moderate, non-binary LDPC codes can achieve better error-correcting performance than binary codes at the cost of higher decoding complexity. As the length of the code and/or the size of the field over which is constructed the code increases, the complicated computations in the check node processing and the large memory requirements put obstacles to efficient hardware implementations. Such implementations require excessive silicon area, making the decoder considerably expensive for practical designs. There is accordingly a need to reduce the computational complexity of the check node processing units for decoding non-binary linear block codes.

SUMMARY

In order to address these and other problems, there is provided a check node processing unit implemented in a decoder. The decoder is configured to decode a signal encoded using an error correcting code. The signal comprises symbols. The check node processing unit is configured to receive at least two input messages and to generate at least one output message. Each message comprises a plurality of components. Each component comprises a value of a symbol and a reliability metrics associated with the symbol. The check node processing unit comprises:
  a data structure configured to store the input messages, the components of the input messages being associated with an integer index in the data structure;
  a data processing unit configured to apply one or more iterations of a transformation operation to at least a part of the data structure. Each iteration of the transformation operation is performed to arrange the components of the input messages in the data structure depending on at least some of the components of the messages associated with a given value of the integer index, which provides a transformed data structure;
  a calculation unit configured to determine at least one output message from the components comprised in the transformed data structure.

According to one embodiment, the transformation operation maybe performed to arrange the components of the input messages in the data structure according to an increasing order of the reliability metrics of the components of the messages associated with a given value of the integer index.

In one embodiment, the number of iterations of the transformation operation maybe predefined.

In a particular embodiment, the number of iterations of the transformation operation maybe determined based on at least one constraint parameter chosen in a group consisting of a signal-to-noise ratio, the number of components comprised in the input messages, the field of construction of the error correcting code, and the decoding iteration number.

According to one embodiment, the calculation unit maybe configured to determine one or more output messages using a syndrome-decoding architecture.

According to another embodiment, the calculation unit maybe configured to determine the output message(s) using a forward-backward architecture involving a plurality of elementary check node processing units.

In one embodiment, the components of the input messages maybe ordered in a decreasing order of the reliability metrics of the symbols.

In another embodiment, the components of the input messages maybe ordered in an increasing order of the reliability metrics of the symbols.

In some embodiments, the reliability metrics of the symbols maybe represented by log-likelihood ratio values.

In one application to non-binary LDPC codes decoding, there is provided a check node processing unit implemented in a decoder for decoding a signal encoded using a non-binary LDPC code with a reduced computational complexity.

There is also provided a receiver for receiving and decoding a signal encoded using an error correcting code. The receiver comprises a decoder according to any preceding feature.

In one application to wireless communication systems, there is provided a wireless device capable of receiving data in a wireless communication system. The wireless device comprises a receiver according to any of the preceding embodiments.

In one application to optical communication systems, there is provided an optical device capable of receiving data in an optical communication system. The optical device comprises a receiver according to any of the preceding embodiments.

There is also provided a method of calculating at least one output message at a check node processing unit implemented in a decoder. The decoder is configured to decode a signal encoded using an error correcting code. The signal comprises symbols. The check node processing unit is configured to receive at least two input messages. Each message comprises a plurality of components. Each component comprises a value of a symbol and a reliability metrics associated with this symbol. The method comprises:
  storing the input messages in a data structure, the components of the input messages being associated with an integer index in the data structure;
  applying one or more iterations of a transformation operation to at least a part of the data structure. Each iteration of the transformation operation being performed to arrange the components of the input messages in the data structure depending on at least some of the components of the messages associated with a given value of the integer index, which provides a transformed data structure;
  determining at least one output message from the components comprised in the transformed data structure.

There is also provided a computer program for calculating at least one output message at a check node processing unit implemented in a decoder. The decoder is configured to decode a signal encoded using an error correcting code. The signal comprises symbols. The check node processing unit is configured to receive at least two input messages. Each message comprises a plurality of components. Each component comprises a value of a symbol and a reliability metrics associated with the symbol. The computer program product comprises:
  a non-transitory computer readable storage medium, and instructions stored on the non-transitory computer readable storage medium that, when executed by a processor, cause the processor to:
    store the input messages in a data structure, the components of the input messages being associated with an integer index in the data structure;
    apply one or more iterations of a transformation operation to at least a part of the data structure. Each iteration of the transformation operation being performed to arrange the components of the input messages in the data structure depending on at least some of the components of the messages associated with a given value of the integer index, which provides a transformed data structure;
    determine at least one output message from the components comprised in the transformed data structure.

Advantageously, the various embodiments allow reducing the number of required input messages to compute output messages at check node processing units. As a result, the computational complexity at check node processing units implemented in error correcting code decoders can be significantly reduced.

Further, the various embodiments allow a reduction of the costs of the hardware implementation of check node processing units, throughput improvements and silicon area savings.

Further advantages of the present invention will become clear to the skilled person upon examination of the drawings and the detailed description. It is intended that any additional advantages be incorporated herein.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, illustrate some embodiments of the invention.

DETAILED DESCRIPTION

Embodiments of the present invention provide, alone or in combination, methods, devices and computer program products for decoding a signal encoded using an error correcting code with a reduced computational complexity. In particular, embodiments provide methods, devices and computer program products for efficient implementations of check node processing units in iterative decoding algorithms used to decode a signal encoded using a non-binary linear block error correcting code.

Methods, devices and computer program products according to the various embodiments may be implemented in several digital data transmission and storage systems with applications for examples in wired, wireless and optical communications, solid state data storage, magnetic and optical recording, digital television and video broadcasting.

The following description of some embodiments of the invention will be made with reference to digital communication systems, for illustration purpose only. However, the skilled person will readily understand that the various embodiments of the invention may be integrated in other types of systems. Exemplary communication systems comprise wired, wireless, acoustic, optical, and molecular systems.

Further, the following description of some embodiments of the invention will be made with reference to linear block error correcting codes, for illustration purpose only. However, the skilled person will readily understand that the various embodiments of the invention apply to any linear codes comprising the convolutional codes and in general to any error correcting.

Figure 1:
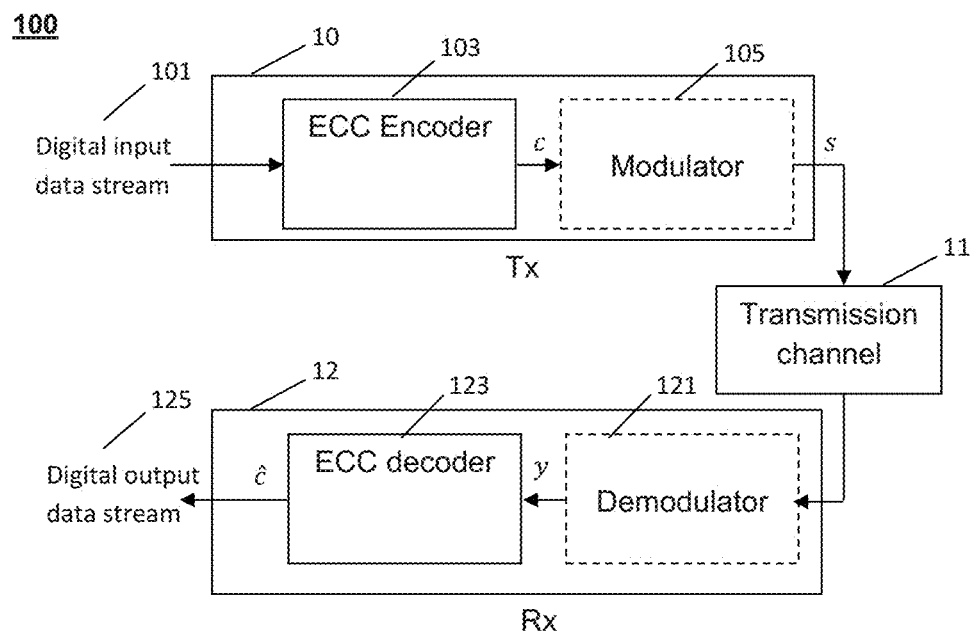
FIG. 1 is a schematic diagram of an exemplary application of the invention to communication systems.

Referring to FIG. 1, there is shown an exemplary implementation of the invention in a digital communication system 100. The communication system 100 may comprise at least a pair of a transmitter device 10 and a receiver device 12. The transmitter device 10 (also referred to hereinafter as a "transmitter") is configured to communicate data information to the receiver 12 (also referred to hereinafter as "receiver") via the transmission channel 11.

According to some embodiments of the invention, the transmitter 10 may comprise an error correcting code (ECC) encoder 103, configured to encode a digital input data stream 101 using a linear block error correcting code into a codeword c. The receiver 12 may be configured to receive a noisy copy of the encoded data, or codeword, through the transmission channel 11. The receiver 12 may comprise an error correcting code decoder 123 configured to deliver an estimate ĉ of the original codeword.

The digital input data 101 may have been previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signal s and to map it into the transmission channel.

The receiver 12 may comprise homologous processing means configured to perform the reverse functions. It may comprise a demodulator 121 configured to demodulate the received signal from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1).

In an application of the invention to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the invention to wireless communication systems such as ad-hoc wireless networks, wireless sensor networks and radio communication systems, the transmitter 10 and receiver 12 may be any type of fixed or mobile wireless device configured to operate in a wireless environment. Exemplary devices in such applications comprise laptops, mobile phones and base stations. The transmission channel 11 may be in this case any wireless propagation medium. Further, the transmission channel 11 may accommodate several pairs of transmitters 10 and receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the invention to optical communication systems such as optical fiber-based systems, the transmitter 10 and receiver 12 may be any optical transceiver device configured to respectively transmit and receive data information propagated over an optical link. Exemplary optical communication systems comprise Polarization Division Multiplexing (PMD) and Mode Division Multiplexed (MDM) systems.

For any type of wired, wireless or optical communication system, the transmission channel 11 may be any noisy channel. The noise may result from the thermal noise of the system components or the intercepted interfering radiation by antennas. Other exemplary sources of noise comprise switching, manual interruptions, electrical sparks and lightning. In some embodiments, the total noise may be modeled by an additive white Gaussian noise (AWGN).

Further, according to some embodiments in application to digital mass storage, the transmission channel 11 may be modeled for example by an erasure channel, a binary symmetric channel, or Gaussian. In such embodiments, the transmission channel 11 may be any type of storage device which can be sent to (written) and received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (Orthogonal Frequency Division Multiplexing) and FBMC (Filter Bank Multi-Carrier).

According to various embodiments, the ECC encoder 103 may implement a linear block error correcting code designated by (n,k); n and k referring respectively to the length and the rank of the code. The ECC encoder 103 encodes accordingly a message vector u of information data of length k into a codeword c, c being a vector of length n. The codeword c comprises therefore n components also referred to hereinafter as "symbols".

For linear codes constructed over Galois Fields, generally denoted by GF(q), where q≥2 designates the cardinality of the code, the symbols take values in GF(q). A codeword c is thus a vector of n symbols that belong each to GF(q). The code is binary if the symbols belong to GF(2). In contrast, when q>2, the code is said non-binary.

Linear block error correcting codes may be represented in a matrix form using a generator matrix denoted by G and a parity-check matrix denoted by H. Using a row notation of vectors, the generator matrix G is of dimensions k×n while the parity-check matrix is of dimensions (n−k)×n. The two matrices are linked by the relation $G \cdot H^t = 0$. In addition, entries of both matrices belong to the corresponding Galois Field. Using the matrix representation, any codeword c satisfies the equation $c \cdot H^t = 0$. This equation is termed "parity-check equation". It defines n parity-check constraints designed to be satisfied by any codeword.

In association with the matrix representation, the linear code may be represented using a bipartite graph $\mathcal{H}$ termed "Tanner graph". This graph comprises n variable nodes and n−k check nodes. Each variable node $i \in \{1, 2, \ldots, n\}$ is associated with a column of the parity-check matrix. Each check node $j \in \{1, 2, \ldots, n-k\}$ is associated with a row of the parity-check matrix, i.e. with a parity-check equation. A variable node i is connected to a check node j if the entry $H_{ij}$ of the parity-check matrix is not zero, i.e. if $H_{ij} \neq 0$. $\mathcal{H}_c(i)$ denotes the set of neighbor check nodes connected to the variable node i. Similarly, $\mathcal{H}_c(i)$ denotes the set of neighbor variable nodes connected to the check node j. The degree of a variable node i (equivalently a check node j) corresponds to the cardinality of the set $\mathcal{H}_c(i)$ (equivalently the cardinality of the set $\mathcal{H}_c(j)$).

The following description of some embodiments will be made with reference to an ECC encoder 103 encoding data using a non-binary LDPC code, for illustration purpose only. However, the skilled person will readily understand that the various embodiments of the invention apply to other non-binary codes and in general to binary and non-binary linear block error correcting codes and non-binary turbo codes.

For the purpose of example, the ECC decoder 123 implements a non-binary LDPC code decoder for decoding the data information encoded by the ECC encoder 103. The ECC decoder 123 may implement any iterative non-binary LDPC code decoder such as the Extended Min Sum algorithm or the min-max algorithm.

In some embodiments, the complexity of the EMS decoding algorithm may be reduced. The accompanying description will be made with reference to the EMS algorithm. However, the skilled person will readily understand that various embodiments apply to any iterative non-binary LDPC code decoder.

Figure 2:
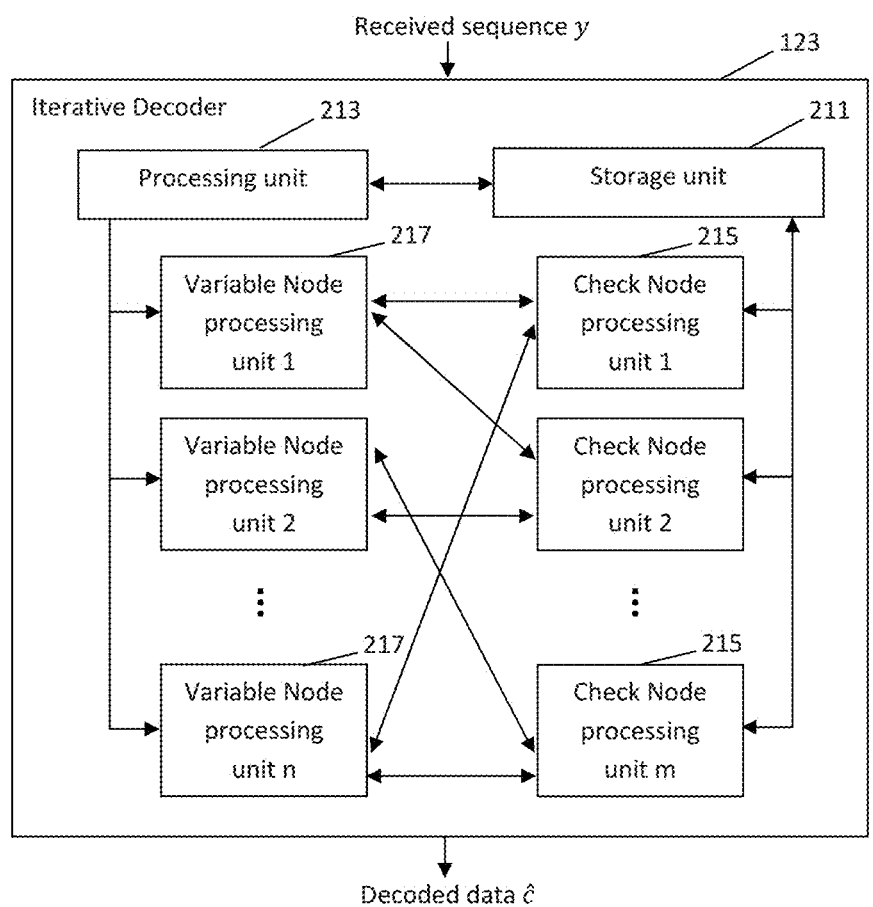
FIG. 2 is a schematic diagram of an iterative decoder according to some embodiments of the invention.

Referring to FIG. 2, there is illustrated a structure of an iterative non-binary LDPC decoder 123 according to some embodiments using the EMS algorithm.

The iterative decoder 123 may be configured to determine an estimate ĉ of the transmitted codeword c by the transmitter 10 from a received noisy sequence y. It may process a signal over several iterations bringing it, at each iteration, closer to the transmitted codeword c.

The iterative decoder 123 may be configured to determine the estimate ĉ based on the Tanner graph representation of the code. Accordingly, the iterative decoder 123 may comprise n variable node processing units 217 and n−k check node processing units 215. Each variable node processing unit 217 corresponds to one variable node in the Tanner graph. Each check node processing unit 215 corresponds to one check node in the Tanner graph. The variable node processing units 217 and check node processing units 215 may be configured to iteratively exchange messages to estimate the most reliable codeword ĉ from the noisy sequence y.

A variable node processing unit 217 corresponding to a variable node i may be configured to receive input messages from the check node processing units 215 corresponding to the set, $\mathcal{H}_v(i)$. A variable node processing unit 217 may be further configured to process these input messages and deliver output messages to at least one check node processing unit 215 corresponding to the check nodes in the set $\mathcal{H}_v(i)$.

Similarly, a check node processing unit 215 corresponding to a check node j may be configured to receive input messages from the variable node processing units 217 corresponding to the set $\mathcal{H}_c(j)$. A check node processing unit 215 may be further configured to process these input messages and deliver output messages to at least one variable node processing unit 217 corresponding to the variable nodes in the set $\mathcal{H}_c(j)$.

The exchange of messages may be initialized by the variable node processing units 217. It may terminate either if the processed signal satisfies the parity-check equation or if a maximum number of iterations is reached without meeting all parity-check constraints. if a maximum number of iterations is reached without meeting all parity-check constraints, the iterative decoder 123 may be configured to deliver the processed signal as an estimate of the original codeword. In the later case, the iterative decoder 123 may be configured to declare a decoding failure.

As illustrated in FIG. 2, the iterative decoder 123 may further comprise a storage unit 211 configured to store the received sequence y. It may also comprise a processing unit 213 configured to determine initial values of output messages to be delivered by the variable node processing units 217 based on the received sequence y loaded from the storage unit 211.

The exchanged messages between the variable node processing units 217 and the check node processing units 215 may carry representative information on the symbols. A message sent from a variable node processing unit 217 corresponding to a variable node i to a check node processing unit 215 corresponding to a check node j in the set $\mathcal{H}_v(i)$ is noted $U_i$. Similarly, a message sent from a check node processing unit 215 corresponding to a check node j to a variable node processing unit 217 corresponding to a variable node i in the set $\mathcal{H}_c(j)$ is noted $V_i$.

According to some embodiments, the length of an exchanged message may be equal to the order of the Galois field used to construct the linear code. Accordingly, each exchanged message $U_i$ and $V_i$ is a vector of length q for codes constructed over GF(q).

In other embodiments related to soft-decision decoding, exchanged messages may carry the values of the symbols and metrics measuring their reliabilities (also referred to hereinafter as 'reliability metrics'). The value of a reliability metrics is related to the reliability of the symbol. In such embodiments, each message $U_i$ and $V_i$ is a vector comprising q pairs of values, a pair comprising a value of a symbol and its reliability metrics. Each component of a message corresponds accordingly to a pair of a value of the symbols in GF(q) and its reliability metrics.

According to some embodiments using the EMS algorithm, the delivered messages to check node processing units 215 may be sorted and truncated for keeping only the N most reliable components with N strictly inferior to q (N≪q). The sorting may be performed in a given order (increasing or decreasing) of the reliability metrics associated with the symbols. Further, the sorting and truncation operations may be performed by the variable node processing units 217 or by the check node processing units 215 receiving the messages as inputs.

In some embodiments, the number of truncated components of the processed messages N may be similar for the variable node processing units and the check node processing units. Alternatively, the different variable and check node processing units may keep a different number of the components associated with the most reliable symbols.

In some embodiments, the reliability metrics of a symbol may correspond to the probability density function of the symbol which represents the probability that the symbol is correct. In particular, the reliability metrics may be represented in the log-domain by a logarithmic likelihood ratio (LLR) value.

The computational complexity of the decoding process is dominated by the computations performed by the check node processing units 215. In one embodiment using the EMS for decoding non-binary LDPC codes, the computational complexity of the processing performed by the check node processing units 215 may be reduced without compromising the decoding error performance.

Figure 3:
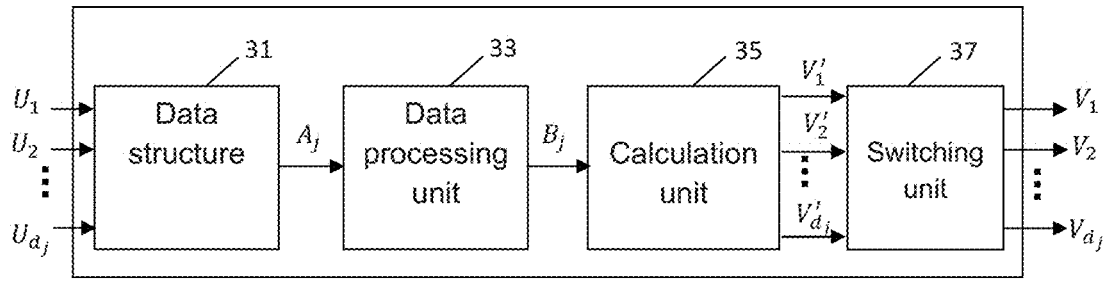
FIG. 3 is a block diagram illustrating the structure of a check node processing unit according to some embodiments of the invention.

Referring to FIG. 3, there is shown a block diagram of a check node processing unit 215 according to some embodiments of the invention. The check node processing unit 215 being associated with a check node j of degree $d_j$. This means that the check node is connected to $d_j$ variable nodes. The check node processing unit 215 may thus be configured to exchange messages with one or more variable node processing units 217 among the $d_j$ variable node processing units 217 associated with the $d_j$ connected variable nodes. Accordingly, at a given iteration, the check node processing unit 215 may be configured to receive $d_j$ input messages and generate one or more output messages. An input or output message is a vector comprising q pairs of symbols and the reliability metrics associated with the q pairs of symbols. The input messages may have been previously sorted and/or truncated.

For the clarity of the presentation of the following embodiments, the input messages received by a check node processing unit associated with a check node j of degree $d_j$ are denoted by $U_1, U_2, \ldots, U_{d_j}$. The output messages are denoted by $V_i$ with $i=1, \ldots, d_j$. It should be noted that this notation is used at the level of the underlying check node j.

The following description will be made with reference to some embodiments using soft-output decoding based on sorting and truncation of the input messages received by the check node processing unit 215. In such embodiments, the input messages are denoted as $\overline{U}_1, \overline{U}_2, \ldots, \overline{U}_{d_j}$. A message $\overline{U}_i$ represents a vector of N pairs, in the form $\overline{U}_i = (\overline{U}_i[N-1], \overline{U}_i[N-2], \ldots, \overline{U}_i[0])$ such that the pair carrying the most reliable symbol corresponds to the component $\overline{U}_i[0]$.

The check node processing unit 215 may comprise a data structure 31 noted by $A_j$ and configured to store the input messages. Exemplary data structures comprise matrices, arrays and lists. Each component of each input message, i.e. each pair of a value of a symbol and its reliability metric, may be associated with one or more integer indexes determining its position in the data structure. For example, the data structure 31 may be a matrix storing the $d_j$ input messages $\overline{U}_1, \overline{U}_2, \ldots, \overline{U}_{d_j}$ such that the columns of this matrix correspond to the transpose of the vectors representing the input messages according to:

$$A_j = [\overline{U}_1^t | \overline{U}_2^t | \ldots | \overline{U}_{d_j}^t] = \begin{bmatrix} \overline{U}_1[N-1] & \ldots & \overline{U}_{d_j}[N-1] \\ \vdots & \ldots & \vdots \\ \overline{U}_1[0] & \ldots & \overline{U}_{d_j}[0] \end{bmatrix} \quad (1)$$

In this example, each component $\overline{U}_i[p]$ for $i=1, \ldots, d_j$ and $p=0, \ldots, N-1$ is associated with a row index and a column index. The matrix $A_j$ is of dimension $N \times d_j$. In addition, in embodiments involving sorted messages in a decreasing order of the reliability metrics, the row index of a component $\overline{U}_i[p]$ may be equal to $N-p$, while its column index may be equal to $i$.

The check node processing unit 215 may also comprise a data processing unit 33 configured to apply one or more iterations of a transformation operation to at least a part of the data structure $A_j$. Each iteration of the transformation operation may be performed to arrange the components of the input messages stored in the data structure $A_j$, depending on at least some of the components of the messages associated with a given value of the one or more integer index (hereinafter referred to as 'transformation index'). The transformation operation provides a transformed data structure noted $B_j$. Transformed input messages in the transformed data structure $B_j$ are noted $U'_i$.

In addition, the check node processing unit 215 may comprise:
- a calculation unit 35 configured to compute one or more intermediary messages $V'_i$ for $i$ varying from 1 to $d_j$, from the data representative of the symbols and their reliability metrics comprised in the transformed data structure $B_j$; and
- a switching unit 37 configured to determine one or more output messages $V_i$ for $i$ varying from 1 to $d_j$, from the intermediary messages $V'_i$.

The switching unit 37 may be configured to apply the reverse of the transformation operation applied to arrange the input messages of the first data structure $A_j$. Such switching operation is implemented to route each output message to its destined variable node processing unit.

In some embodiments, the transformation parameters may comprise a maximum number of iterations noted $N_{max,tr}^{(j)}$ and an integer transformation index associated with each iteration. The transformation parameters may be loaded from the storage unit 211. In such embodiments, the data processing unit 33 may be configured to select, at a given iteration of a transformation operation, some components of the input messages structured in the first data structure $A_j$. At least one integer index of the selected components may be determined based on the integer transformation index of the corresponding iteration of the transformation operation. The data processing unit 33 may be further configured to determine the transformed data structure $B_j$ by arranging the components of the data structure $A_j$ in a given order of the reliability metrics associated with the selected components.

In some embodiments, for instance when the input messages are sorted, the data processing unit 35 may be performed to arrange the components of the data structure according to an increasing order of the reliability metrics of the selected components.

In other embodiments where the input messages are not sorted, the data processing unit 35 may be configured to perform a number of iterations of the transformation operation in order to sort the components of each input message according to a given order of the reliability metrics associated with the components.

For example, in embodiments in which the data structure $A_j$ is a matrix according to equation (1), a transformation operation may correspond to a permutation of some columns of this matrix. In such embodiments, the integer transformation index may represent a row index. The data processing unit 33 may accordingly select the components $\overline{U}_i[p]$ such that their row indexes are equal to the integer transformation index. Permutation may be therefore performed such that at least some of the selected components $\overline{U}_i[p]$ are arranged in an increasing order of their associated reliability metrics.

The maximum number of iterations may be the same for computation units 35 of all check node processing units 215 or may differ from one computation unit to another. Further, the maximum number of iterations may be predefined or may be determined based on at least one constraint parameter. The check node processing unit 215 may be in this case configured to determine a constraint parameter in a group consisting of the signal-to-noise ratio, the number $N$ of components in each input message, the field over which is constructed the used error correcting code $C(n,k)$, and the decoding iteration number.

The calculation unit 35 may implement a serial, parallel or mixed architecture for computing the intermediary messages from the structured data in the transformed data structure $B_j$. Exemplary parallel architectures comprise a syndrome decoding-based architecture. Exemplary serial architectures comprise the forward-backward architecture.

Figure 4:
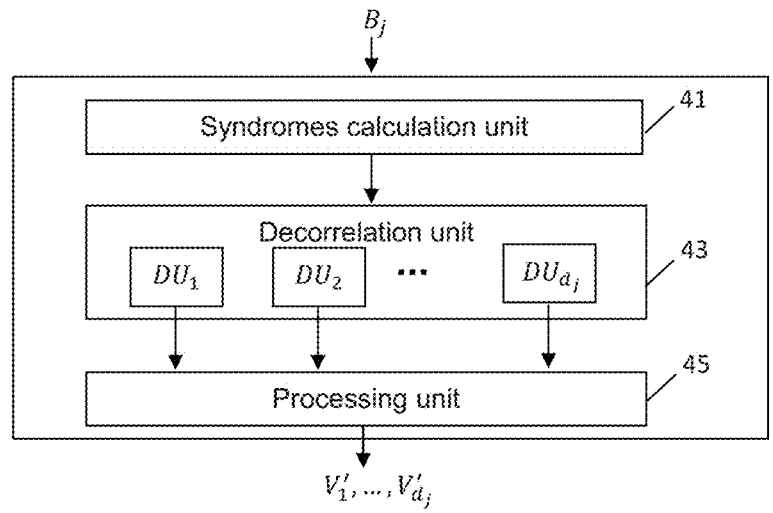
FIG. 4 is a block diagram representing the calculation unit of a check node processing unit according to an application of the invention to a syndrome decoding architecture.

Referring to FIG. 4, there is shown a structure of a calculation unit 35 implementing a parallel architecture based on syndrome decoding. The calculation unit 35 may, in such embodiments, comprise:
- a syndrome calculation unit 41 configured to determine a plurality of syndromes. As used herein, a syndrome represents a vector comprising $d_j$ pairs of a value of symbols and the reliability metrics of the symbol. The syndrome calculation unit 41 may be configured to determine the syndromes from the data representative of the input messages $U_i$ structured in the transformed data structure $B_j$.
- a decorrelation unit 43 configured to determine a plurality of decorrelated syndromes from the computed syndromes. The decorrelation unit 43 may comprise $d_j$ elementary decorrelation units $DU_i$, $i=1, \ldots, d_j$ 43. Each elementary decorrelation unit $DU_i$ 43 may be configured to determine a decorrelated syndrome vector, by subtracting the contribution of the input message $U_i$ from the computed syndrome vector.
- a processing unit 45 configured to determine the intermediary messages $V'_i$ for $i=1, \ldots, d_j$ from the computed decorrelated syndrome vectors. In some embodiments of the invention, the processing unit 45 may be further configured to perform an ordering and truncation of the intermediary messages such that only the most reliable components are kept and the redundant components are removed.

The transformation of the input messages in combination with the syndrome-decoding architecture still improves the complexity. In particular, the arrangement of the data representative of the symbols in the data structure $B_j$ enables a significant reduction on the number of computed syndromes.

Figure 5:
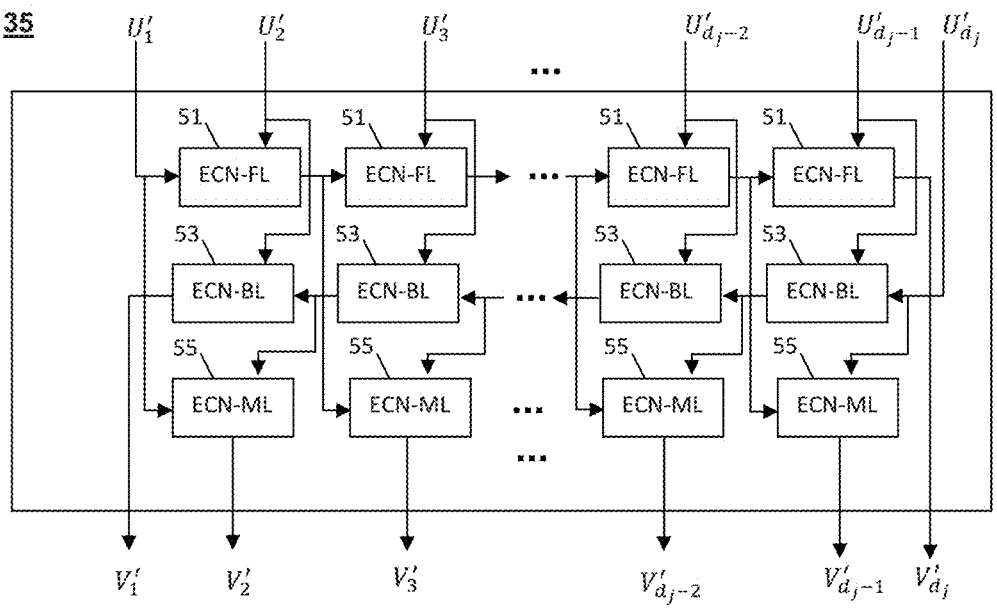
FIG. 5 is a block diagram representing the calculation unit of a check node processing unit according to an application of the invention to a forward-backward architecture.

FIG. 5 shows a structure of a calculation unit 35 implementing a serial architecture based on the forward-backward architecture.

In such embodiments, the calculation unit 35 may comprise a plurality of elementary check node processing units. More specifically, for $d_j$ input messages, the calculation unit 35 may comprise $(3d_j-6)$ elementary check node processing units. These processing units may be partitioned into 3 categories associated with three processing layers referred to hereinafter as a 'forward layer', a 'backward layer' and a 'merging layer'. The forward layer may comprise $d_j-2$ elementary check node processing units ECN-FL 51. The backward layer may comprise $d_j-2$ elementary check node processing units ECN-BL 53. The merging layer may comprise $d_j-2$ elementary check node processing units ECN-ML 55.

Each elementary check node processing unit ENC-FL 51, ECN-BL 53 and ECN-ML 55 of each processing layer may be configured to receive two or more input messages and determine an elementary message by performing an operation on the received input messages. In general, input messages received by an elementary check node may originate from the transformed messages in the transformed data structure $B_j$ or from an elementary message computed by another elementary check node that belongs to the same or a different processing layer.

More specifically, one or more ECN-FL 51 may be configured to receive input messages from the transformed messages $U'_i$ comprised in the transformed data structure $B_j$. Remaining ECN-FL 51 may be configured to receive at least one input message comprised in the transformed data structure $B_j$ and at least one elementary message computed by another ECN-FL 51 located at the same forward layer.

Similarly, one or more ECN-BL 53 may be configured to receive input messages from the transformed messages $U'_i$ comprised in the transformed data structure $B_j$. Remaining ECN-BL 53 may be configured to receive at least one input message comprised in the transformed data structure $B_j$ and at least one elementary message computed by another ECN-FB 53 located at the same backward layer.

ECN-ML 55 may be configured to receive input messages from at least one elementary message computed by an ECN-FL 51 or at least one elementary message computed by an ECN-BL 53.

The transformation of the input messages represents several advantages in combination with the forward-backward architecture. The operations performed by the elementary check node processing units may be simplified. The elementary check node processing units may have accordingly different architectures in the sense that they perform different operations, thus enabling in some configurations a parallel implementation of the forward-backward architecture. As a result, high speed implementations with reduced complexity may be designed while offering optimal error decoding performance.

Figure 6:
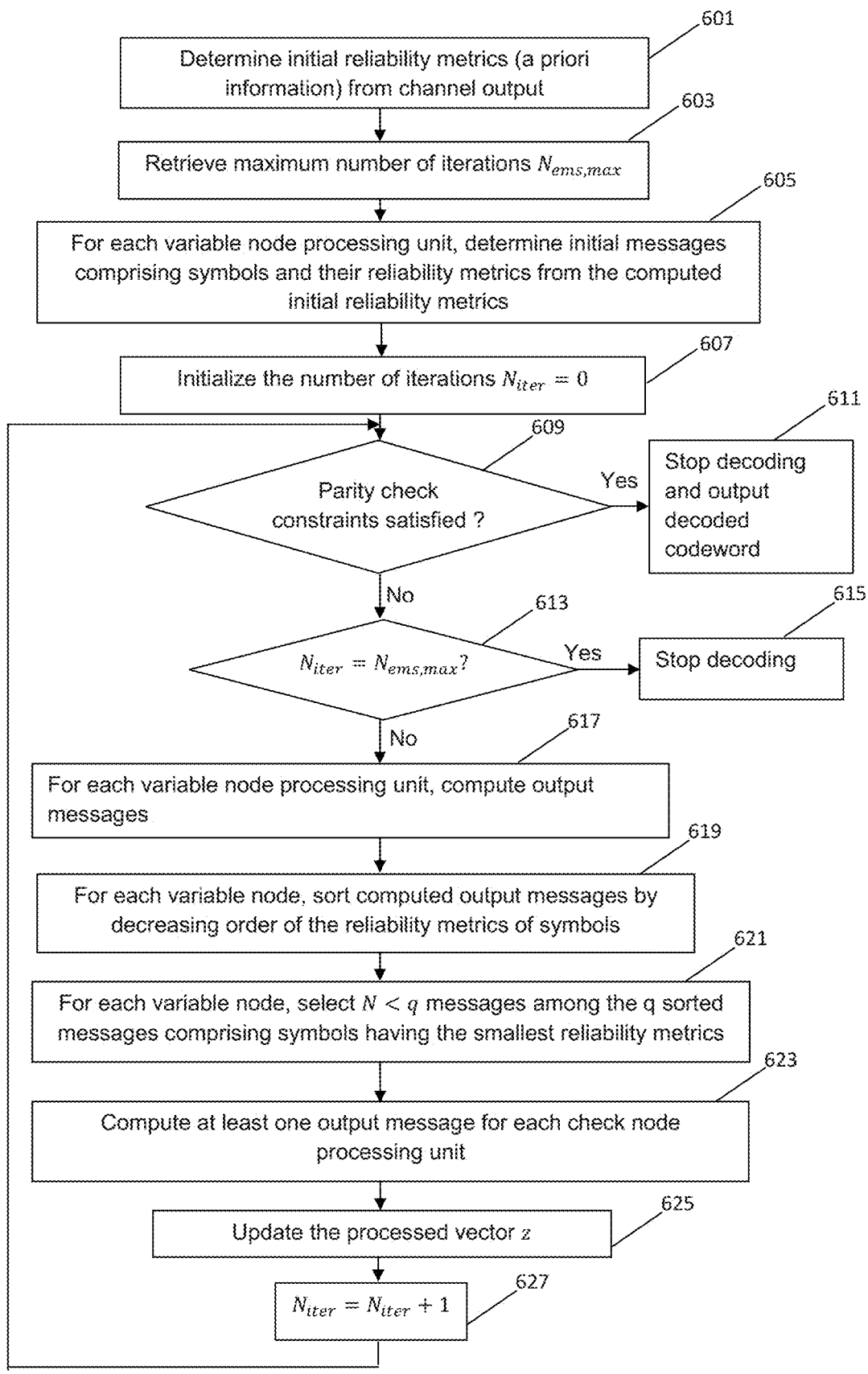
FIG. 6 is a flowchart depicting an iterative decoding method using an Extended Min Sum algorithm according to some embodiments of the invention.

FIG. 6 is a flowchart illustrating a decoding method of non-binary LDPC codes according to various embodiments based on iterative decoding using the EMS algorithm and a flooding implementation in which all the variable node processing units process their messages in a first turn, then in a second turn all the check node processing unit process their output messages.

The following description of some embodiments will be made with reference to soft-output decoding and reliability metrics represented in the logarithm domain by log-likelihood ratio (LLR) values, for illustration purpose only. However, the skilled person will readily understand that other types of decoding and reliability metrics may be used to measure the reliability of symbols. For instance, the reliability metrics may be a quadratic distance or any monotonic function of the probability density function of symbols.

The decoding method comprises a step of determining an estimate c of an original codeword c from a received noisy sequence represented by a vector y by applying optimal MAP decoding. The codeword c is encoded at the transmitter using a non-binary LDPC code designated by C(n,k) constructed over the Galois Field GF(q) with q>2. C denotes the codebook or the alphabet to which the different codewords belong. The received sequence can be written as function of a transmitted codeword according to:

$$y=c+w \quad (2)$$

In equation (2), w designates a vector of length n modeling the noise altering the communication channel.

The MAP decoding rule for the correct codeword is equivalent to minimizing the probability of a codeword error, or equivalently, to maximizing the a posteriori probability p(c|y). Using the Bayes' rule, the MAP decoding criterion is given by:

$$\hat{c}_{MAP} = \mathrm{argmax}_{c \in C} p(c|y) = \underset{c \in C}{\mathrm{argmax}} \frac{p(y|c)p(c)}{p(y)} \quad (3)$$

The codewords are assumed uniformly distributed in the codebook C, therefore p(c) and p(y) are assumed independent of c. As a result, the MAP decoding rule in equation (3) can be replaced by the maximum-likelihood (ML) rule given by:

$$\hat{c}_{MAP} = \mathrm{argmax}_{c \in C} p(y|c) \quad (4)$$

A codeword may be represented in a row form as $c=(c_1, \ldots, c_n)$ where $c_i$, $i=1, \ldots, n$ denote the discrete samples representing the symbols. The symbols take values in the set $GF(q)=\{0, 1, \ldots, q-1\}=\{\alpha_0, \alpha_1, \ldots, \alpha_{q-1}\}$ with $\alpha_0=0$. The received sequence may be similarly represented as $y=(y_1, \ldots, y_n)$. Each component $y_i$ of the received sequence for $i=1, \ldots, n$ may be accordingly written as:

$$y_i = c_i + w_i \quad (5)$$

The communication channel is assumed memoryless in which the probability distribution of the output sequence depends only on the current channel input. Thus, equation (4) can be rewritten as:

$$\hat{c}_{MAP} = \mathrm{argmax}_{c \in C} \prod_{i=1}^{n} p(y_i | c_i) \quad (6)$$

The log-domain decoding rule of equation (6) can be expressed according to:

$$\hat{c}_{MAP} = \mathrm{argmax}_{c \in C} \sum_{i=1}^{n} \log(p(y_i | c_i)) \quad (7)$$

In particular embodiments, the noise may be modeled by an Additive White Gaussian Noise (AWGN) of zero-mean and variance $\sigma^2$ per sample, i.e. $w_i \sim \mathcal{N}(0, \sigma^2)$ for $i=1, \ldots, n$. Accordingly, the communication channel can be characterized by the transition probability density function (pdf) $p(y_i|c_i)$ as described by:

$$p(y_i|c_i = \alpha_t) = \frac{1}{\sqrt{2\pi}\,\sigma} \exp\left(-\frac{(y_i - \alpha_t)^2}{2\sigma^2}\right) \quad (8)$$

In equation (8), $\alpha_t \in \{\alpha_0, \ldots, \alpha_{q-1}\}$ designates a value that may be taken by the symbol $c_i$. $p(y_i|c_i=\alpha_t)$ denotes the conditional probability density function of the $i^{th}$ channel output knowing that the $i^{th}$ symbol is equal to $\alpha_t$.

Given the channel output, step 601 may be performed to determine values of initial reliability metrics from the channel output. The initial reliability metrics are also referred to hereinafter as the "a priori information".

Using log-domain MAP decoding, the reliability metrics may be derived in the form of a log-likelihood ratio for each symbol based on the received sequence. The LLR is a metric measuring the reliability of a symbol. One definition of the LLR metric involves a fixed reference symbol. A reference symbol of the symbol $c_i$ noted $\beta_i$ may correspond to the most reliable symbol satisfying:

$$\beta_i = \mathrm{argmax}_{t=0,\ldots,q-1} p(a_t|y_i) \quad (9)$$

Using such definition of the LLR metric, the most reliable symbols are those that have smallest LLR values. Accordingly, for the $i^{th}$ symbol $c_i$, the LLR value for this symbol to be equal to $\alpha_t$ is noted $LLR_t(c_i)$ and may be expressed as:

$$LLR_t(c_i) = -\log\left(\frac{p(c_i = \alpha_t|y_i)}{p(c_i = \beta_i|y_i)}\right) \quad (10)$$

In equation (10), the minus sign may be used to enable dealing with positive LLR values. The initial LLR values may be derived using the probability density function of the received sequence. The $LLR_t(c_i)$ may be first expressed equivalently as:

$$LLR_t(c_i) = -\log\left(\frac{p(y_i|c_i = \alpha_t)}{p(y_i|c_i = \beta_i)}\right) - \log\left(\frac{p(c_i = \alpha_t)}{p(c_i = \beta_i)}\right) \quad (11)$$

For equally distributed symbols, the second term in equation (11) can be removed. As a result, deriving the initial LLR values $LLR_t(c_i)$ for the different symbols may be solved using the probability density function in equation (8). To avoid confusion, the a priori information of the $i^{th}$ symbol $c_i$ is noted $\lambda_t(c_i)$ for $t=0,\ldots,q-1$.

Using the log-likelihood ratio values the MAP estimate in equation (7) may be expressed as:

$$\hat{c}_{MAP} = \mathrm{argmax}_{c \in C} \sum_{i=1}^{n} \log(p(y_i|c_i)) = \quad (12)$$

$$\mathrm{argmax}_{c \in C} \sum_{i=1}^{n} \sum_{t=0}^{q-1} \log\left(\frac{p(c_i = \alpha_t|y_i)}{p(c_i = \beta_i|y_i)}\right) + K$$

In equation (12), K is a term independent from c and is defined by:

$$K = \sum_{i=1}^{n} \sum_{t=0}^{q-1} p(y_i | c_i = \beta_t) \quad (13)$$

The MAP optimization rule in equation (12) can be therefore simplified as:

$$\hat{c}_{MAP} = \mathrm{argmax}_{c \in C} \sum_{i=1}^{n} \sum_{t=0}^{q-1} -LLR_t(c_i) \quad (14)$$

According to equation (14), the MAP decoding rule in the log-domain is similar to finding the codeword that minimizes the sum of the LLR.

The computed initial reliability metrics will be used during the iterative decoding process as initial messages to be delivered by the variable node processing units. Exchanging messages carrying such reliability metrics during a number of iterations enables to process a decoded message $z=(z_1, z_2, \ldots, z_n)$ for generating an estimate c to bring it closer to the MAP estimate $\hat{c}_{MAP}$. For z to be a codeword it should satisfy all the parity-check equations i.e. $z \cdot G^t = 0$. The decoded message z may be initialized as $z=(\beta_1, \beta_2, \ldots, \beta_n)$.

As the computed reliability metrics of a given symbol differs from a variable node processing unit and a check node processing, the following notation will be considered to facilitate the understanding of the following embodiments:

the LLR values computed by a variable node processing unit i for a check node processing unit j will be noted $LLRV^{(ij)}(\cdot)$.

the LLR values computed by a check node processing unit j for a variable node processing unit i will be noted $LLRC^{(ji)}(\cdot)$.

Moreover, as non-binary codes are considered, it should be noted that summation and multiplicative operations on GF elements are performed over the Galois field GF(q).

In step 603, the maximum number $N_{ems,max}$ of iterations of the decoding process may be retrieved from memory. This maximum number of iterations may have an impact on the decoding performance and complexity. A small number of iterations may be required if the available computational and memory resources are limited. A large number of iterations enabling for better decoding performance may be for example required in the presence of a high noise level, i.e. at low signal-to-noise ratio. The maximum number of iterations may be therefore, in some embodiments, adjusted as function of the noise level.

In step 605, messages $U_i$ to be delivered by the variable nodes processing units $i=1, \ldots, n$ to their connected neighbor check nodes $j=1, \ldots, n-k$ may be initialized from the computed a priori information in step 601. Using a local notation at the level of a check node j and a variable node i, a message $U_i$ is a vector comprising q pairs of a symbol t and the reliability metrics of this symbol in the form of an LLR value $LLRV^{(ij)} = \lambda_t$.

According to some embodiments, the symbols carried by the various messages during the messages update between the variable node processing units and the check node processing units may be multiplied by a scaling factor. The scaling factor may depend on the value comprised in the parity-check matrix. The following description will be made with reference to a unitary scaling factor, for illustration purpose only. However, the skilled person will readily understand that the various embodiments apply to any value of the scaling factor.

In step 607, the number of performed iterations $N_{iter}$ of the iterative decoding process may be initialized to zero, $N_{iter}=0$.

In step 609, the parity-check equations may be checked to verify if all the parity-check constraints are satisfied by the processed vector z.

If it is determined that z satisfies the parity-check equation by $z \cdot G^t = 0$, then step 611 may be performed to stop the decoding process and deliver the decoded codeword $\hat{c} = z$.

If it is determined in step 609 that the parity-check constraints are not met, step 613 may be performed to check if the maximum number of iterations $N_{ems,max}$ is reached, i.e.

if $N_{iter}=N_{ems,max}$. If it is determined that the number of performed iteration reached the maximum one, step 615 may be performed to stop decoding and declare a decoding failure. If it is determined that the maximum number of iterations is not reached yet, steps 617 to 625 may be performed to run one iteration of the messages exchange between the variable node and check node processing units.

In step 617, output messages $U_i$ of each variable node processing unit may be computed.

During the first iteration of the messages exchange, the output messages may correspond to the messages determined in step 605. During any later iteration, the output messages of a given variable node processing unit i may be computed using also the received messages from its connected check node processing units in the set $\mathcal{H}_v(i)$. For a variable node processing unit i associated with a variable node of degree $d_i$, there are $d_i$ received messages $V_j$ from the connected neighborcheck nodes $j=1, \ldots, d_i$. The reliability metrics of a symbol t from a variable node perspective may be accordingly given by:

$$LLRV_{H^{ji}\times t}^{(ij)} = \left(\lambda_t + \sum_{j' \in d_i \setminus j} LLRC_{s^{j'i}}^{(j'i)}\right)\Big| s^{j'i} \times (H^{j'i})^{-1} = t \quad (15)$$

In step 619, the output messages computed by the variable node processing units may be sorted according to an order of the reliability metrics of the symbols.

In one embodiment, the messages may be sorted in a decreasing order of the reliability metrics.

In step 621, sorted output messages may be truncated to keep only data representative of the most reliable symbols that have the smallest reliability metrics. The q sorted components (pairs) in each output message computed by a variable node processing unit may be accordingly reduced to N pairs, N being inferior than q (N<<q). The sorted messages are denoted as $\overline{U}_1, \overline{U}_2, \ldots, \overline{U}_{d_i}$. A sorted message comprising N pairs, in the form $\overline{U}_i=(\overline{U}_i[N-1], \overline{U}_i[N-2], \ldots, \overline{U}_i[0])$ such that the pair carrying the most reliable symbol corresponds to the component $\overline{U}_i[0]$.

The sorting and/or truncation operations may be performed by the variable node processing units or by the check node processing units receiving the messages as inputs.

In step 623, output messages of check node processing units may be computed from the received input messages sent by the connected variable node processing units. For a check node processing unit associated with a check node j of degree $d_j$, the message $V_i$ may be computed using the $d_j$ sorted input messages $\overline{U}_{i'}$ received from the variable node processing units which are associated with the $\mathcal{H}$ variable nodes i' in the set $\mathcal{H}_c(j)$.

In step 625, the processed vector z may be updated, based on the data representative of the symbols comprised on the computed messages $V_i$, by the check node processing units. The $i^{th}$ symbol $z_i$ may correspond the optimization problem given by:

$$z_i = \mathrm{argmin}_{t=0,\ldots,q-1} \tilde{\lambda}_t \quad (16)$$

With:

$$\tilde{\lambda}_t = \lambda_t + \sum_{j \in \mathcal{H}_c(i)} LLRC_{s^{ji}}^{(ji)} | s^{ji} \times (H^{ji})^{-1} = t \quad (17)$$

The number of performed iterations of the messages exchange may be then incremented in step 627.

Figure 7:
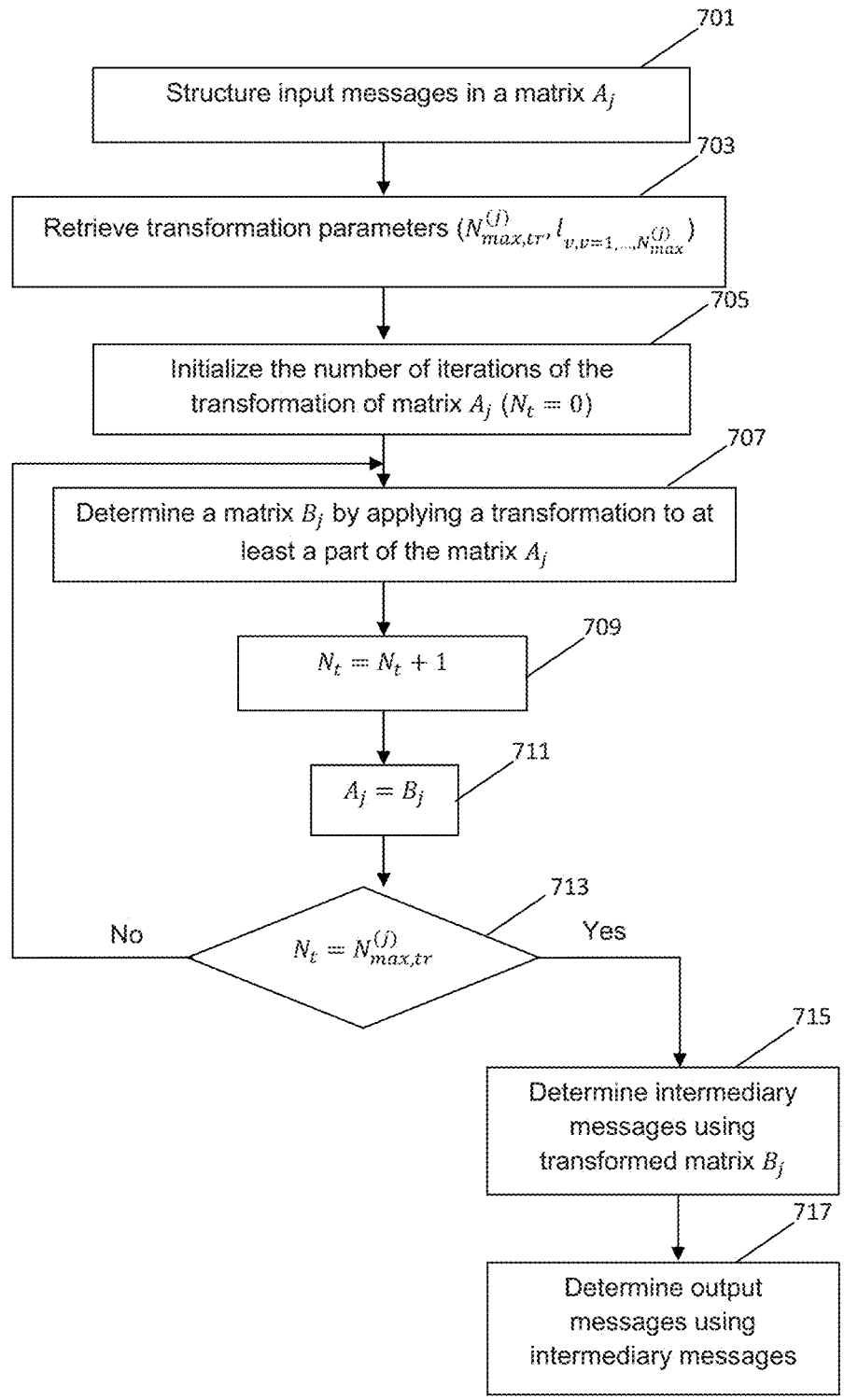
FIG. 7 is a flowchart illustrating a method of determining output messages at check node processing units according to some embodiments of the invention.

FIG. 7 is a flowchart depicting a method of computing the output messages at the level of a check node processing unit associated with a check node j of degree $d_j$ according to some embodiments. The check node processing unit may receive two or more input messages $\overline{U}_i$ for $i \in \mathcal{H}_c(j)$ and may generate one or more output message $V_i$. As the input messages have been sorted and truncated, they may be ordered as $\overline{U}_i=(\overline{U}_i[N-1], \overline{U}_i[N-2], \ldots, \overline{U}_i[0])$. A component $\overline{U}_i[p]$ for $p=1, \ldots, N$ carries a Galois Field symbol denoted as $GF_p^{(ij)}$ and its reliability metrics denoted as $LLRV_{GF_p^{(ij)}}^{(ij)}$. The pair carrying the most reliable symbol is the component $\overline{U}_i[0]$ Step 701 may be performed to structure the received input messages in a first data structure data $A_j$. Exemplary data structures comprise matrices, arrays and lists. Each component of each input message, i.e. each pair of a value of a symbol and the reliability metrics of this symbol, is associated with one or more integer indexes determining its position in the data structure.

In some embodiments, the $d_j$ input messages $\overline{U}_1, \overline{U}_2, \ldots, \overline{U}_{d_j}$ may be structured in a matrix $A_j$ such that the columns of this matrix correspond to the transpose of the vectors representing the input messages according to:

$$A_j = [\overline{U}_1^t | \overline{U}_2^t | \ldots | \overline{U}_{d_j}^t] = \begin{bmatrix} \overline{U}_1[N-1] & \ldots & \overline{U}_{d_j}[N-1] \\ \vdots & \ldots & \vdots \\ \overline{U}_1[0] & \ldots & \overline{U}_{d_j}[0] \end{bmatrix} \quad (18)$$

In this example, each component $\overline{U}_i[p]$ for $i=1, \ldots, d_j$ and $p=0, \ldots, N-1$ is associated with a row and a column index. The matrix $A_j$ is in this case of dimension $N \times d_j$. In addition, in embodiments involving sorted messages in a decreasing order of the reliability metrics, the row index of a component $\overline{U}_i[p]$ may be equal to N−p, while its column index may be equal to i.

Output messages computed by calculation unit (35) may be determined using the data representative of the symbols comprised in a transformed data structure derived by applying one or more iterations of a transformation $T^{(j)}$ to the data structure $A_j$. A transformation $T^{(j)}$ is defined by a transformation criterion and two or more transformation parameters.

Step 703 may be performed to retrieve two or more transformation parameters comprising a maximum number of transformations noted $N_{max,tr}^{(j)}$ and an integer transformation index $1_{v,v=1,\ldots,N_{max,tr}^{(j)}}$ associated with each iteration of the transformation $T^{(j)}$. The integer transformation index may be any integer number comprised in the interval of values [1, N−1].

The transformation parameters may be retrieved from storage or memory means. The following description will be made with reference to a transformation $T^{(j)}$ defined by the couple of parameters comprising a maximum number of transformations and an integer index for each iteration $$T^{(j)} = \{N_{max,tr}^{(j)}, I_{v,v=1,\ldots,N_{max,tr}^{(j)}}\},$$

for illustration purpose only.

In one embodiment, the transformation parameters may be the same for two or more check node processing units.

In another embodiment, the check node processing units may use one or more different transformation parameters.

Further, according to one embodiment, the maximum number of iterations for each calculation unit may be predefined (deterministic), for example equal to one (1) or two (2). Alternatively, the maximum number of iterations may be determined based on at least one constraint parameter chosen in a group consisting of the signal-to-noise ratio, the number of components in each input message to the corresponding check node processing unit, the order of the field over which is constructed the used error correcting code, and the decoding iteration number.

Step 705 may be performed to initialize the number of performed iterations of the transformation $T^{(j)}$ to zero, $N_t=0$.

Steps 707 to 713 may be repeated until the number of performed iterations $N_t$ reaches the maximum number of iterations $N_{max,tr}^{(j)}$.

At each iteration of the transformation operation, a transformed data structure $B_j$ may be determined in step 707. An iteration of the transformation operation may be performed with respect to the corresponding integer transformation index. Accordingly, some components of the input messages structured in the data structure $A_j$ such that at least one integer index of the selected components may be determined based on the integer transformation index of the corresponding iteration. A transformed data structure $B_j$ may be determined by arranging at least some components of the first data structure $A_j$ according to an arrangement criterion related to the reliability metrics associated with at least a part of the selected components.

In some embodiments, where the input messages are sorted, the arrangement criterion may be the ordering of the selected components in the data structure $A_j$ in an increasing order of the reliability metrics associated with at least a part of these selected components.

In another embodiment where the data structure $A_j$ is a matrix given by equation (18), the transformation operation may correspond to a permutation of some columns of this matrix. In such embodiment, the integer transformation index associated with a given iteration $l_v$ may represent a row index. Accordingly, at least some of the components of the input messages structured in $A_j$ and having a row index equal to the integer transformation index $l_v$ may be first selected as shown in equation (19) in a dashed rectangle:

$$A_j = \begin{bmatrix} \overline{U}_1[N-1] & \ldots & \overline{U}_{d_j}[N-1] \\ \vdots & & \vdots \\ \overline{U}_1[N-l_v] & \ldots & \overline{U}_{d_j}[N-l_v] \\ \vdots & & \vdots \\ \overline{U}_1[0] & \ldots & \overline{U}_{d_j}[0] \end{bmatrix} \quad (19)$$

A transformed data structure $B_j$ maybe then determined by arranging at least some of the components of the matrix $A_j$. The arrangement may be performed by applying a permutation of at least some columns of this matrix according to an increasing order of the reliability metrics associated with at least some of the components $\overline{U}_i[N-l_v]$, for i varying from 1 to $d_j$. A transformed matrix $B_j$ maybe accordingly written as:

$$B_j = \begin{bmatrix} U'_1[N-1] & \ldots & U'_{d_j}[N-1] \\ \vdots & \vdots & \vdots \\ U'_1[N-l_v] & \ldots & U'_{d_j}[N-l_v] \\ \vdots & \vdots & \vdots \\ U'_1[0] & \ldots & U'_{d_j}[0] \end{bmatrix} \quad (20)$$

In equation (20), components $U_i[p]=(GF_p^{(ij)}, LLRV_{GF_p^{(ij)}}^{(ij)})$ represent intermediary components resulting from the arrangement of the components $\overline{U}_i[p]$. They satisfy the arrangement criterion given by: $LLRV'_{N-l_v}^{(ij)} \le LLRV'_{N-l_v}^{(ij)}$ for $1 \le i < i' \le d_j$.

In a particular embodiment, the integer transformation index $l_v$ associated with a given transformation iteration may be advantageously set equal to N-1. In such embodiments, the arrangement of the components of the matrix $A_j$ maybe performed such that at least some of the entries $U'_1[N-l_v]$, $U'_2[N-l_v], \ldots, U'_{d_j}[N-l_v]$ are sorted in an increasing order of their associated reliability metrics.

Further, the probability that the symbol $z_i$ equals to $GF_0^{(ij)}$ carried by the component $\overline{U}_i[0]$, for i=1, . . . , $d_j$, can be approximated by:

$$LLRV_0^{(ij)} \approx \frac{1}{1+\exp(-LLRV_1'^{(ij)})} \quad (21)$$

Using the approximation of equation (21), arranging the input messages using a value of the integer transformation index equal to N-1 enables advantageously the reduction of the complexity of processing the input messages at the check node processing.

Step 709 may be performed to increment the number of executed iterations of the transformation $T^{(j)}$. Step 711 may be performed to replace the first data structure $A_j$ by its transformed version $B_j$.

Step 713 may be performed to check if the maximum number of iterations of the transformation $T^{(j)}$ is reached.

If it is determined that the number of performed iterations reached the maximum number of iterations of the transformation operation, step 715 may be performed to determine intermediary messages $V'_t$ using the data representative of the symbols and their reliability metrics comprised in the transformed data structure $B_j$.

In step 805, the computed pairs of associated with each connected variable node may be sorted in a decreasing order of the reliability metrics of the symbols $GF_t^{(ij)}$. Each intermediary message $V'_t$ may be accordingly determined by selecting the N most reliable symbols and their reliability metrics in the corresponding set of ordered symbols $GF_t^{(ij)}$ for t=1, . . . , N. An intermediary message $V'_t$ comprises thus symbols the symbols $p=GF_t^{(ij)}$ for p, t=1, . . . , N and their reliability metrics from a check node perspective $LLRC_p^{(ij)}=LLR\_GF_t^{(ij)}$.

Step 717 may be performed to determine one or more output messages $V_i$ for i varying from 1 to with $d_j$ from the intermediary messages $V'_t$ in order to route each output message to its destined variable node processing unit.

Even if the invention is not limited to such applications, the invention has particular advantages for computing the intermediary messages with a reduced complexity, in a syndrome-based architecture.

Figure 8:
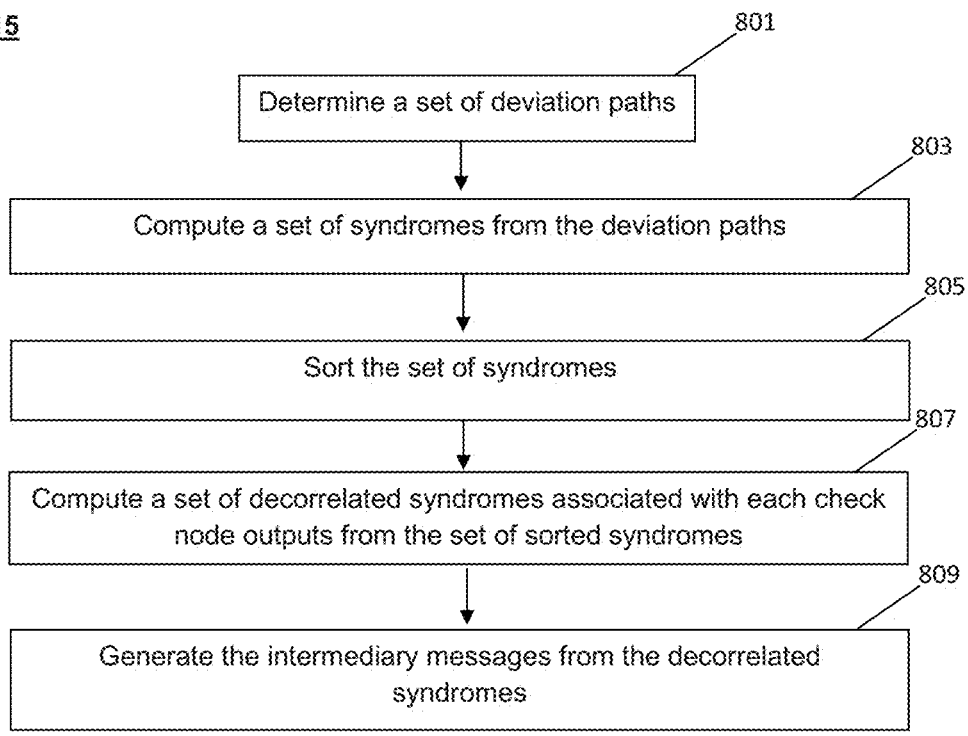
FIG. 8 is a flowchart depicting a method of determining intermediary messages at check node processing units according to an application of the invention to a syndrome decoding architecture.

FIG. 8 is a flowchart depicting a method of computing the intermediary messages using the data representative of the symbols and their reliability in the data structure $B_j$ (step 715) according to some embodiments of the invention using syndrome decoding.

In step 801, a set of deviation paths may be determined for the check node processing unit associated with a check node j of degree $d_j$. A deviation path $dp_a^{(j)}$ represents a set of components $U'_1[p_1^{(a)}], U'_2[p_2^{(a)}], \ldots, U'_{d_j}[p_{d_j}^{(a)}]$ extracted from the transformed data structure $B_j$ such that $p_k^{(a)}$ vary from 0 to N−1. The deviation paths may be grouped in a configured set noted $Conf^{(j)}=\{dp_1^{(j)}, dp_2^{(j)}, \ldots, dp_D^{(j)}\}$ with D designating the cardinality of the configuration set. A component U $$U'_{pk_j}[p_k^{(a)}] = \left(GF_{p_k^{(a)}}, LLRV'^{(p_k,j,a)}_{GF_{p_k^{(a)}}}\right)$$

of the $a^{th}$ deviation path is a pair comprising the symbol $GF_{p_k^{(a)}}$ and its reliability metrics $$LLRV'^{(p_k,j,a)}_{GF_{p_k^{(a)}}}.$$

In step 803, a set $S^{(j)}$ of syndromes $S_1^{(j)}, S_2^{(j)}, \ldots, S_D^{(j)}$ may be computed using the configuration set $Conf^{(j)}$. A syndrome $S_a^{(j)}$ may be determined for each deviation path $dp_a^{(j)}$. Each syndrome $S_a^{(j)}$ may comprise a value of a Galois field element noted $GF_t^{(j,a)}$ and its reliability metrics noted $Synd\_GF_t^{(j,a)}$ for $t=0, \ldots, q-1$. The reliability metrics may be computed using the deviation paths in the configuration $Conf^{(j)}$ determined in step 801 such that:

$$Synd\_GF_t^{(j,a)} = \sum_{k=1,\ldots,d_j} LLRV'^{(p_k,j,a)}_{GF_{p_k^{(a)}}} \qquad (22)$$

The corresponding Galois field element $GF_t^{(j,a)}$ may be determined according to:

$$GF_t^{(j,a)} = \sum_{k=1,\ldots,d_j} GF_{p_k^{(a)}} \qquad (23)$$

It should be noted that operations on Galois field elements such as in equation (23) are performed in the Galois field.

In step 805, the computed set of syndromes may be sorted in a decreasing order of the reliability metrics of the symbols $GF_t^{(ij)}$.

In step 807, a set of decorrelated syndromes in association with each intermediary vector $V'_i$ may be determined using the sorted syndromes. In particular, for each component $V_i[t]$, a decorrelated syndrome $S'^{(ji)}_j=(t, Synd\_GF_t^{(ij)})$ may be computed according to:

$$Synd\_GF_t^{(ji)}=\min_{a=1,\ldots,N_s}(Synd_{GF_e^{(j,a)}} - LLRV_f^{(ji,a)})|e+f=t \qquad (24)$$

Each intermediary message $V'_i$ may be accordingly determined in step 807 by selecting the N most reliable symbols and their reliability metrics in the corresponding sets of decorrelated syndromes. An intermediary message $V'_i$ comprises thus the symbols $GF_p^{(ij)}$ for $p=0, \ldots, N-1$ and their reliability metrics from a check node perspective given by:

$$LLRC^{(ji)}_{GF_p^{(ij)}} = Synd\_GF_{GF_p^{(ij)}}^{(ji)} \qquad (25)$$

The cardinality D of a configuration set may impact the decoding complexity and/or performance. For the EMS algorithm, a configuration set may comprise all the possible deviation paths that can be extracted from the transformed data structure $B_j$. The cardinality is noted in such case $D_{max}$.

In some embodiments, the generation of a configuration set may be performed such that for a given number of deviation paths, the configuration set comprises the first given number of deviation paths with the highest probability to contribute to an output message. Such configuration set generation may be performed by Monte-Carlo simulations for a given error correcting code, a given signal-to-noise ratio and a given number of iterations of the iterative decoding process.

Figure 9:
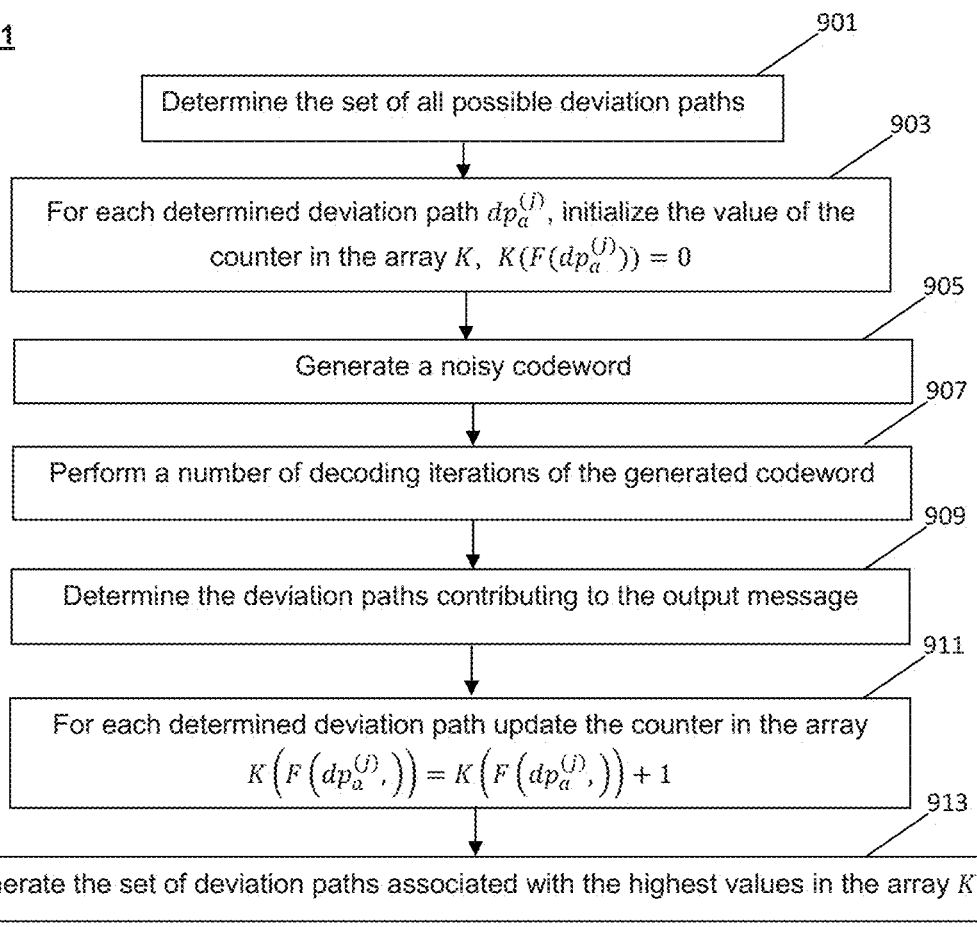
FIG. 9 is a flowchart depicting a method of determining a configuration set according to some embodiments in application to a syndrome decoding.

FIG. 9 is a flowchart illustrating a method of generating a set of the deviation paths at a check node processing unit (step 801) according to some embodiments. The set of deviation paths is accordingly generated based on a counting of the number of times the deviation paths contributed to the computation of output messages during the decoding of a noisy codeword over several iterations. The values of the counters corresponding to the different deviation paths may be saved in an array noted as K in association with a function F defined, for each deviation path $dp_a^{(j)}$, by:

$$F: dp_a^{(j)} \to \sum_{r=1}^{d_j} dp_a^{(j)} \times N^{r-1} \qquad (26)$$

The array K may accordingly comprise $N^{d_j}$ counting values, each value being associated with a deviation path. The set of deviation paths generated according to this embodiment correspond to the deviation paths associated with the highest counting values in the array K.

Step 901 may be performed to determine an initial configuration set comprising all possible values of deviations paths.

Step 903 may be performed to initialize, for each deviation path $dp_a^{(j)}$ comprised in the initial configuration set, its counter value in the array K such that:

$$K(F(dp_a^{(j)}))=0 \qquad (27)$$

Step 905 may be performed to generate a noisy codeword.
Step 907 may be performed to apply a number of decoding iterations of the generated noisy codeword.
Step 909 may be performed to determine, for the corresponding check node processing unit, the deviation paths that contributed to the calculation of the output messages delivered by the check node processing unit.
Step 911 may be performed to update, for each determined deviation path in step 909, the corresponding counter number in the array K( ) such that:

$$K(F(dp_a^{(j)}))=K(F(dp_a^{(j)}))+1 \qquad (28)$$

Step 913 may be performed to generate the set of deviation paths associated with the highest values of the array K.

The arrangement of the input messages according to some embodiments of the invention allows reducing the number of syndromes used to compute the intermediary messages, thereby reducing the complexity of computing the output messages at a check node processing unit.

In some embodiments, using the forward-backward architecture involving elementary check node processing units, the arrangement of the input messages according to various embodiments of the invention allows a significant reduction of the computational complexity of each elementary check node processing unit. In particular, the operations performed by an elementary check node processing unit may be simplified to simple Galois field adders. Further, elementary check node processing units are generally identical, i.e. implement the same operations. However, using the arrangement of the input messages enables an adaptation of the performed operation at each elementary check node, reducing thereby the total computational complexity involved at a given check node processing unit.

Figure 10:
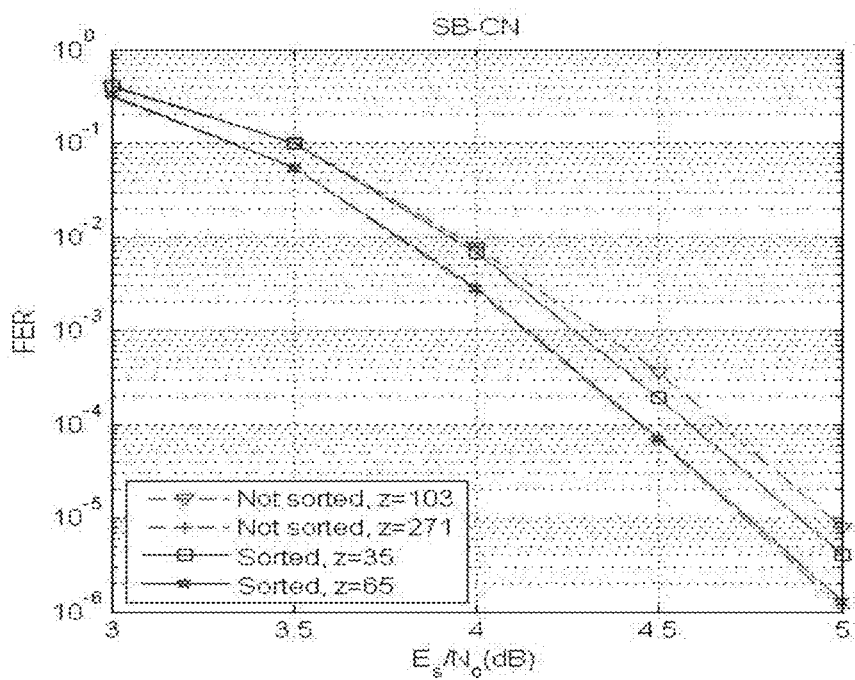
FIG. 10 is a diagram illustrating the Frame Error Rate (FER) obtained using the syndrome-decoding architecture according to some embodiments.

FIG. 10 illustrates the error probability performance evaluated in terms of the Frame Error Rate of decoding a (576,480) non-binary LDPC code over GF(64) under the AWGN channel using the EMS algorithm according to some embodiments. The FER is evaluated for four implementations of the EMS algorithm using the syndrome decoding architecture for different values of the number of deviation paths referred to in the legend as 'z'. Not sorted and Sorted refer respectively to embodiments with an iteration of the transformation operation and embodiments without applying the transformation operation. As shown by numerical results, EMS decoding according to such embodiments provide optimal decoding performance as the traditional EMS algorithm with a significant reduction on the number of deviation paths used for computing output messages. As a result, the decoding complexity may be drastically reduced without sacrificing the error performance.

Figure 11:
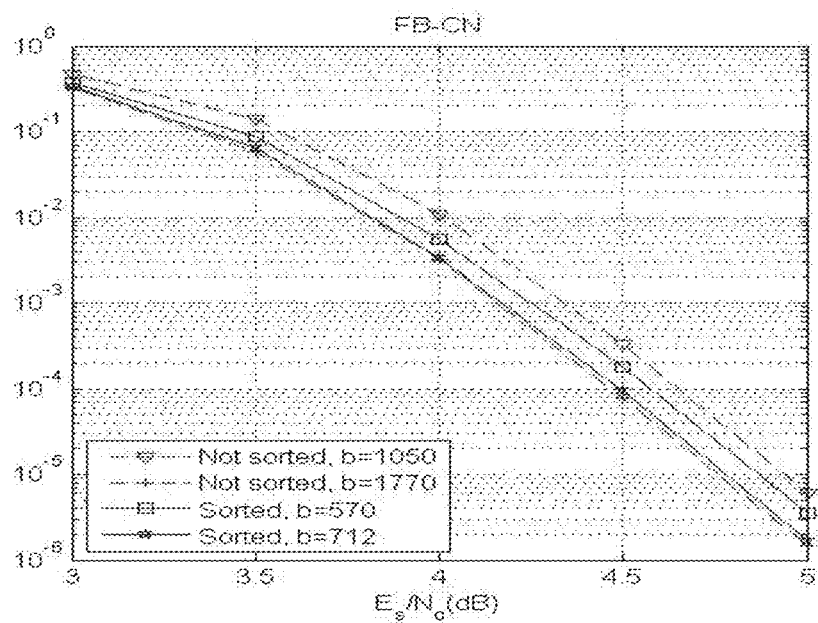
FIG. 11 is a diagram illustrating the Frame Error Rate obtained using the forward-backward architecture according to some embodiments.

FIG. 11 illustrates the error probability performance evaluated in terms of the Frame Error Rate of decoding the same code considered in the numerical results depicted in FIG. 10. The Frame Error Rate is evaluated for implementations of the EMS algorithm using the forward-backward architecture for different values of the processed bubbles for output messages computation. Not sorted and Sorted refer respectively to embodiments with an iteration of the transformation operation and embodiments without applying the transformation operation. Numerical results show that the proposed method presents a significant reduction of the decoding complexity in terms of latency and the hardware footprint.

The description of the EMS algorithm according to the various embodiments has been performed for a particular implementation where all the variable node processing units operate in a first turn, and then all the check node processing units update the messages to be sent to the variable nodes. This specific scheduling is known as flooding scheduling. In particular, the processing of all check nodes may operate serially or at different degrees of parallelism from 2 to all. It should be noted that the invention applies to other scheduling comprising scheduling known as horizontal and vertical scheduling. In a first example called horizontal scheduling, the check nodes may operate serially, updating all variable nodes connected to the check node. It should be also noted that a group a check nodes may operate in parallel, updating all variable nodes connected provided there is no variable node in conflict (two check nodes connected to the same variable node). In a second example called vertical scheduling, the variable nodes may operate serially, updating all check nodes connected to them.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as example, in one or more FPGA, ASIC or VLSI integrated circuits with the corresponding memory) or according to a configuration using both VLSI and DSP.

Further, while some embodiments of the invention have been described in application to communication systems, it should be noted that the invention is not limited to communication devices and may be integrated in numerous devices such as data storage devices.

Furthermore, the methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

While embodiments of the invention have been illustrated by a description of various examples, and while these embodiments have been described in considerable detail, it is not the intent of the applicant to restrict or in any way limit the scope of the appended claims to such details. Additional advantages and modifications will readily appear to those skilled in the art. The invention in its broader aspects is therefore not limited to the specific details, representative methods, and illustrative examples shown and described.

The invention claimed is:

1. A check node processing unit implemented in a decoder, said decoder being configured to decode a signal encoded using an error correcting code, said signal comprising symbols, the check node processing unit being configured to receive at least two input messages and to generate at least one output message, each message comprising a plurality of components, each component comprising a value of a symbol and a reliability metrics associated with said symbol, wherein the check node processing unit comprises:
    a data structure configured to store said input messages, the components of the input messages being associated with an integer index in the data structure;
    a data processing unit configured to apply one or more iterations of a transformation operation to at least a part of the data structure, a number of iterations of the transformation operation being determined based on at least one constraint parameter chosen in a group consisting of a single-to-noise ratio, a number of components in said input messages, field of construction of said error correcting code, and a decoding iteration number, said transformation operation being a data arrangement operation, each iteration of the transformation operation being performed to arrange the components of the input messages in said data structure depending on at least some of the components of the input messages associated with a given value of the integer index, which provides a transformed data structure, said transformed data structure being a data structure comprising arranged components;
    a calculation unit configured to determine said at least one output message from the components of the input messages comprised in said transformed data structure.

2. The check node processing unit of claim 1, wherein each iteration of a transformation operation is performed to arrange the components of the input messages in said data structure according to a given order of the reliability metrics of the components of the messages associated with said given value of the integer index.

3. The check node processing unit of claim 1, wherein a number of iterations of the transformation operation is predefined.

4. The check node processing unit of claim 1, wherein the calculation unit is configured to determine said at least one output message using a syndrome-decoding architecture.

5. The check node processing unit of claim 4, wherein the calculation unit is configured to determine said at least one output message using a plurality of elementary check node processing units.

6. The check node processing unit of claim 5, wherein said components of said input messages are ordered in a decreasing order of the reliability metrics of the symbols.

7. The check node processing unit of claim 1, wherein said reliability metrics is represented by a log-likelihood ratio.

8. The check node processing unit of claim 1, wherein said error correcting code is a non-binary LDPC code.

9. A receiver configured to receive and decode a signal encoded using an error correcting code, wherein the receiver comprises a decoder according to claim 1 configured to decode said signal.

10. A wireless device capable of receiving data in a wireless communication system, wherein the wireless device comprises the receiver according to claim 9 configured to receive and decode a signal encoded using an error correcting code.

11. An optical device capable of receiving data in an optical communication system, wherein said optical device comprises the receiver according to claim 9 configured to receive and decode a signal encoded using an error correcting code.

12. A storage device capable of receiving data in a data storage system, wherein said storage device comprises the receiver according to claim 9 configured to receive and decode a signal encoded using an error correcting code.

13. A method for calculating at least one output message at a check node processing unit implemented in a decoder, said decoder being configured to decode a signal encoded using an error correcting code, said signal comprising symbols, the check node processing unit being configured to receive at least two input messages, each message comprising a plurality of components, each component comprising a value of a symbol and a reliability metrics associated with said symbol, the components of each input message being ordered according to an order of the reliability metrics of said symbols, wherein said method comprises:

storing said input messages in a data structure, the components of the input messages being associated with an integer index in said data structure;

applying one or more iterations of a transformation operation to at least a part of said data structure, a number of iterations of the transformation operation being determined based on at least one constraint parameter chosen in a group consisting of a signal-to-noise ratio, a number of components in said input messages, a field of construction of said error correcting code, and a decoding iteration number, said transformation operation being a data arrangement operation, each iteration of said transformation operation being performed to arrange the components of the input messages in said data structure depending on at least some of the components of the input messages associated with a given value of the integer index, which provides a transformed data structure, said transformed data structure being a data structure comprising arranged components;

determining said at least one output message from the components of the input messages comprised in said transformed data structure.

14. A computer program product for calculating at least one output message at a check node processing unit implemented in a decoder, said decoder being configured to decode a signal encoded using an error correcting code, said signal comprising symbols, said check node processing unit being configured to receive at least two input messages, each message comprising a plurality of components, each component comprising a value of a symbol and a reliability metrics associated with said symbol, the components of each input message being ordered according to an order of the reliability metrics of said symbols, the computer program product comprising:

a non-transitory computer readable storage medium, and instructions stored on the non-transitory computer readable storage medium that, when executed by a processor, cause the processor to:

store said input messages in a data structure, the components of the input messages being associated with an integer index in said data structure;

apply one or more iterations of a transformation operation to at least a part of said data structure, said transformation operation being a data arrangement operation, a number of iterations of the transformation operation being determined based on at least one constraint parameter chosen in a group consisting of a signal-to-noise ratio, a number of components in said input messages, a field of construction of said error correcting code, and a decoding iteration number, each iteration of said transformation operation being performed to arrange the components of the input messages in said data structure depending on at least some of the components of the input messages associated with a given value of the integer index, which provides a transformed data structure, said transformed data structure being a data structure comprising arranged components;

determine said at least one output message from the components of the input messages comprised in said transformed data structure.

* * * * *